(12) United States Patent
Buckley

(10) Patent No.: US 7,595,098 B2
(45) Date of Patent: Sep. 29, 2009

(54) METHOD AND APPARATUS FOR DEPOSITING MATERIAL ON A SUBSTRATE

(75) Inventor: Alastair Robert Buckley, Sheffield (GB)

(73) Assignee: Microemissive Displays Limited, Edinburgh (GB)

( * ) Notice: Subject to any disclaimer, the term of this patent is extended or adjusted under 35 U.S.C. 154(b) by 0 days.

(21) Appl. No.: 10/551,747

(22) PCT Filed: Apr. 2, 2004

(86) PCT No.: PCT/GB2004/001469

§ 371 (c)(1), (2), (4) Date: Aug. 8, 2006

(87) PCT Pub. No.: WO2004/087986

PCT Pub. Date: Oct. 14, 2004

(65) Prior Publication Data

US 2007/0028841 A1 Feb. 8, 2007

(30) Foreign Application Priority Data

Apr. 3, 2003 (GB) .................................. 0307745.0

(51) Int. Cl.
*C23C 16/448* (2006.01)
(52) U.S. Cl. ............... 427/585; 427/595; 118/723 EB; 118/723 FE
(58) Field of Classification Search ............... 427/595, 427/585, 566; 118/723 EB, 723 FE
See application file for complete search history.

(56) References Cited

U.S. PATENT DOCUMENTS 3,552,352 A * 1/1971 McConnell ................. 118/720
3,660,158 A * 5/1972 Chen et al. .................. 427/566
3,791,852 A 2/1974 Bunshah
3,892,490 A * 7/1975 Uetsuki et al. .............. 356/388
4,192,253 A * 3/1980 Aichert et al. .............. 118/712
4,303,694 A * 12/1981 Bois .......................... 427/566
4,328,763 A * 5/1982 Sommerkamp et al. ..... 118/727
4,472,453 A 9/1984 Hoffman (Continued)

FOREIGN PATENT DOCUMENTS

WO WO 03/095698 A2 * 11/2003

(Continued)

OTHER PUBLICATIONS

Kapsa, R., et al., "The AES and EELS study of thin alumina films deposited on niobium". Vacuum, vol. 50, No. 1-2, pp. 233-235, 1998.*

(Continued)

*Primary Examiner*—Bret Chen
(74) *Attorney, Agent, or Firm*—Howson & Howson LLP

(57) ABSTRACT

A method and apparatus for depositing material on a substrate is provided in which material (4) is deposited on a substrate (8) by arranging the material in a container (2), and contacting the surface of the material (4) with a beam of electrons so as to evaporate the material and transfer it to the substrate. A shield (7) opaque to electrons is arranged to cover a portion of the surface contacted by the beam of electrons. Relative movement occurs between the container (2) on one hand and the shield (7) and the beam of electrons on the other hand such that the portion of the surface previously contacted by the beam of electrons is no longer covered by the shield and is exposed to the substrate (8).

10 Claims, 1 Drawing Sheet

U.S. PATENT DOCUMENTS

| | | | | |
|---|---|---|---|---|
| 4,514,437 | A * | 4/1985 | Nath | 427/566 |
| 4,516,525 | A * | 5/1985 | Bourgeois et al. | 118/688 |
| 4,676,994 | A * | 6/1987 | Demaray | 427/566 |
| 4,748,935 | A * | 6/1988 | Wegmann | 118/723 EB |
| 4,769,290 | A * | 9/1988 | Hettich et al. | 428/432 |
| 4,777,908 | A * | 10/1988 | Temple et al. | 118/719 |
| 4,866,239 | A * | 9/1989 | Egermeier | 219/121.15 |
| 4,882,198 | A * | 11/1989 | Temple et al. | 427/567 |
| 4,944,245 | A * | 7/1990 | Stoessl et al. | 118/726 |
| 5,122,389 | A * | 6/1992 | Yasunaga | 427/567 |
| 5,182,488 | A * | 1/1993 | Hill et al. | 313/446 |
| 5,216,690 | A * | 6/1993 | Hanks | 373/10 |
| 5,227,203 | A * | 7/1993 | Kibe et al. | 427/523 |
| 5,309,022 | A * | 5/1994 | Gill et al. | 257/743 |
| 5,549,979 | A * | 8/1996 | Miyazaki et al. | 428/831.2 |
| 5,588,995 | A * | 12/1996 | Sheldon | 117/201 |
| 5,785,763 | A * | 7/1998 | Onda et al. | 118/723 EB |
| 5,861,599 | A * | 1/1999 | Smith et al. | 219/121.15 |
| 5,878,074 | A * | 3/1999 | Buchanan et al. | 373/11 |
| 6,342,103 | B1 | 1/2002 | Ramsay | |
| 6,589,351 | B1 * | 7/2003 | Bruce et al. | 118/726 |
| 6,663,755 | B2 * | 12/2003 | Gorokhovsky | 204/298.41 |
| 6,949,879 | B1 | 9/2005 | Wright et al. | |
| 7,057,193 | B2 * | 6/2006 | Akutsu | 250/492.22 |
| 2002/0127438 | A1 * | 9/2002 | Cook | 428/701 |
| 2004/0012016 | A1 | 1/2004 | Underwood et al. | |
| 2004/0037949 | A1 | 2/2004 | Wright | |
| 2004/0070334 | A1 | 4/2004 | Buckley et al. | |
| 2004/0097161 | A1 | 5/2004 | Gourlay | |
| 2006/0006798 | A1 | 1/2006 | Buckley | |
| 2006/0099731 | A1 | 5/2006 | Buckley et al. | |
| 2006/0124869 | A1 * | 6/2006 | Yoneyama et al. | 250/492.23 |

OTHER PUBLICATIONS

Kury, P., et al., "Compact and transferable threefold evaporator for molecular beam epitaxy in ultrahigh vacuum". Review of Scientific Instruments 76, 083906 (2005), pp. 1-5.*

Patent Abstracts of Japan, English language Abstract of JP 60-165374, Aug. 1985.

Patent Abstracts of Japan, English language Abstract of JP 60-165373, Aug. 1985.

Patent Abstracts of Japan, English language Abstract of JP 60-181265, Sep. 1985.

* cited by examiner

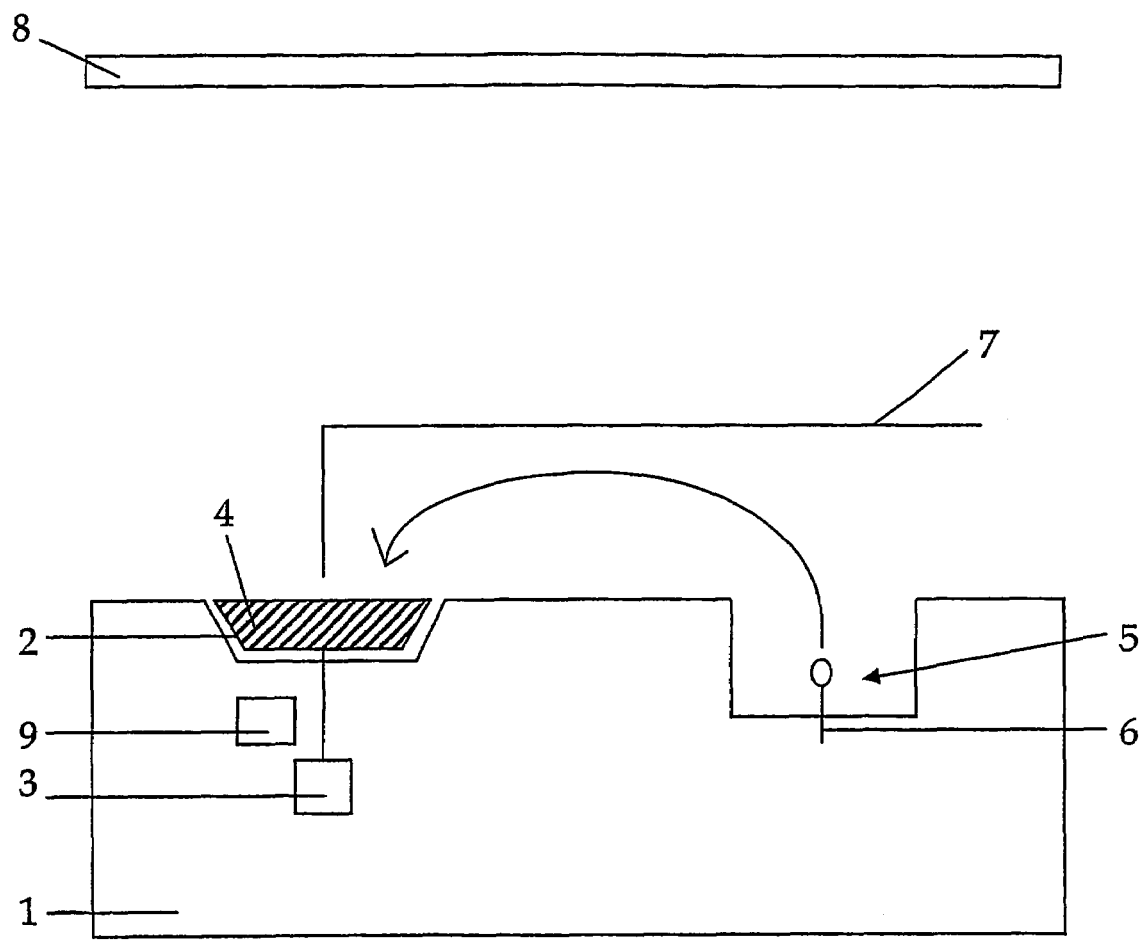

METHOD AND APPARATUS FOR DEPOSITING MATERIAL ON A SUBSTRATE

BACKGROUND TO THE INVENTION

This invention relates to a method and apparatus for depositing material on a substrate.

The invention is particularly, but not exclusively, applicable to the deposition of an encapsulating material on a substrate already bearing sensitive material. For example, a semiconducting substrate bearing an array of organic light emitting diodes (OLEDs) may have a top electrode comprising a layer of low work function material such as calcium. Calcium is extremely reactive with oxygen and water and it is therefore required to coat the calcium layer with an encapsulating layer, for example of aluminum oxide or silicon dioxide, in order to prevent the ingress of oxygen and water.

One method of deposition of the encapsulating material which has been suggested is electron beam evaporation. This involves causing a hot filament to emit electrons, which impact the surface of the encapsulating material contained in a crucible. Under a high vacuum the electrons cause the encapsulating material to be evaporated and transferred to the substrate.

A major disadvantage of electron beam evaporation is the presence of secondary electrons which are emitted from the encapsulating material. These secondary electrons would damage polymeric layers of an OLED such as to render useless any OLED device sought to be fabricated.

Magnetic fields have been suggested as a means of confining the secondary electrons. However, magnetic fields are ineffective when the surface of the encapsulating material in the crucible is rough or when the secondary electrons have a wide range of energies and/or directions.

SUMMARY OF THE INVENTION

It is an aim of the invention to provide a method of depositing material on a substrate using electron beam evaporation in which damage to the substrate caused by secondary electrons is prevented or minimized.

Accordingly, the invention provides a method of depositing material on a substrate comprising the steps of arranging the material to be deposited in a container such that the material has a free surface, and contacting said surface with a beam of electrons to so as to evaporate the material and transfer the material to the substrate, a shield opaque to electrons being arranged to cover a portion of the surface contacted by said beam of electrons, and causing relative movement between the container on one hand and the shield and the beam of electrons on the other hand such that said portion of the surface previously contacted by the beam of electrons is no longer covered by the shield and is exposed to the substrate.

The shield prevents secondary electrons from reaching the substrate, and material is evaporated from a portion of the surface not actually contacted by the beam of electrons but still subject to residual heat by virtue of having been so contacted previously.

The relative movement may in particular comprise relative rotation and the container may be moved whilst the shield and beam of electrons are held stationary.

If the residual heat from the beam of electrons is insufficient, the material may be heated by a heat source additional to the beam of electrons.

The invention also provides apparatus for depositing material on a substrate, comprising a container for containing the material to be deposited, an electron gun for contacting the material with a beam of electrons so as to evaporate the material and transfer the material to the substrate, a shield opaque to electrons arranged to cover a portion of the container, and means for causing relative movement between the container on one hand and the shield and the electron gun on the other hand.

The means for causing relative movement may in particular comprise means for rotating the container about an axis.

The apparatus may comprise means for heating the material, additional to the electron gun.

BRIEF DESCRIPTION OF THE DRAWING

In order that the invention may be more readily understood, reference will now be made, by way of example only, to the accompanying drawing, the single FIGURE of which is a schematic view of apparatus according to an embodiment of the invention.

DETAILED DESCRIPTION OF A PARTICULAR EMBODIMENT

The drawing shows apparatus comprising a platform 1 on which a crucible 2 is arranged for rotation about an axis, driven by means such as an electric motor 3. A known electron beam evaporation apparatus comprises a turntable which rotates such that different materials can be selected for evaporation. According to the invention, this turntable is replaced by the crucible 2. The crucible 2 contains an encapsulating material 4.

An electron gun 5 comprises a filament 6 which emits an electron beam, represented by the arrow. A shield 7 covers a portion (e.g. half of the surface of the material 4 in the crucible 2, and the electron beam is incident on this portion. All of the secondary electrons emitted from the material are trapped by the shield 7.

The portion of the surface of the material 4 not covered by the shield 7 faces a substrate 8. Material evaporated from this exposed portion of the surface is transferred to the substrate 8.

An optional supplementary heat source 9, such as an electrical heat source, may be provided for heating the material 4.

All forms of the verb "to comprise" used in this specification have the meaning "to consist of or include".

The invention claimed is:

1. A method of depositing material on a substrate comprising the steps of arranging the material to be deposited in a container such that the material has a surface, and contacting said surface with a beam of electrons so as to evaporate the material and transfer the material to the substrate, a shield opaque to electrons being arranged to cover a portion of the surface including a location underneath the shield at which location said beam of electrons impacts the surface, and causing relative rotational movement between the container on one hand and the shield and the beam of electrons on the other hand such that said portion of the surface previously contacted by the beam of electrons is no longer covered by the shield and is exposed to the substrate.

2. A method according to claim 1, wherein the container is moved whilst the shield and beam of electrons are held stationary.

3. A method according to claim 2, further comprising the step of heating the material by means of a heat source additional to the beam of electrons.

4. A method according to claim 1, further comprising the step of heating the material by means of a heat source additional to the beam of electrons.

5. Apparatus for depositing material on a substrate, comprising a container for containing the material to be deposited, an electron gun for contacting the material with a beam of electrons so as to evaporate the material and transfer the material to the substrate, a shield opaque to electrons arranged to cover a portion of the container including a location underneath said shield at which location said beam of electrons impacts a surface of the material, and means for causing relative rotational movement between the container on one hand and the shield and electron gun on the other hand.

6. Apparatus according to claim 5, wherein the means for causing relative rotational movement comprises means for rotating the container about an axis.

7. Apparatus according to claim 6, further comprising means additional to the electron gun for heating the material.

8. Apparatus according to claim 5, further comprising means additional to the electron gun for heating the material.

9. A method of depositing material on a substrate, comprising the steps of:

arranging the material to be deposited in a container such that the material has a surface;

arranging a shield opaque to electrons to cover a portion of the surface relative to the substrate;

contacting the surface with a beam of electrons such that the beam of electrons is incident on the portion of the surface covered by the shield; and causing relative rotational movement between the container on one hand and the shield and the beam of electrons on the other hand such that the portion of the surface previously contacted by the beam of electrons is no longer covered by the shield and is exposed to the substrate so as to evaporate the material and transfer the material to the substrate.

10. A method according to claim 9, wherein secondary electrons emitted from the material where the beam of electrons is incident on the surface are trapped by the shield and are prevented from reaching the substrate.

* * * * *